United States Patent
Tsai et al.

(10) Patent No.: US 10,025,175 B2
(45) Date of Patent: Jul. 17, 2018

(54) METHOD AND SYSTEM TO PREPARE, MANUFACTURE AND INSPECT MASK PATTERNS FOR A SEMICONDUCTOR DEVICE

(71) Applicant: TAIWAN SEMICONDUCTOR MANUFACTURING COMPANY, LTD., Hsin-Chu (TW)

(72) Inventors: Chi-Ming Tsai, Taipei (TW); Chih-Chiang Tu, Tauyen (TW); Wen-Hao Cheng, Hsinchu (TW); Ru-Gun Liu, Zhubei (TW); Shuo-Yen Chou, Ji-an Shiang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 698 days.

(21) Appl. No.: 14/536,031

(22) Filed: Nov. 7, 2014

(65) Prior Publication Data

US 2016/0132627 A1    May 12, 2016

Related U.S. Application Data

(60) Provisional application No. 62/049,531, filed on Sep. 12, 2014.

(51) Int. Cl.
   *G06F 17/50* (2006.01)
   *G03F 1/36* (2012.01)
   *G03F 1/78* (2012.01)

(52) U.S. Cl.
   CPC .............. *G03F 1/36* (2013.01); *G03F 1/78* (2013.01); *G06F 17/5081* (2013.01)

(58) Field of Classification Search
   USPC ........................................... 716/53
   See application file for complete search history.

(56) References Cited

U.S. PATENT DOCUMENTS

| | | | |
|---|---|---|---|
| 8,683,396 B2 | 3/2014 | Hu et al. | |
| 8,812,999 B2 | 8/2014 | Liu et al. | |
| 2009/0013303 A1 | 1/2009 | Hwang et al. | |
| 2012/0096412 A1* | 4/2012 | Fujimura | G06F 17/5077 716/53 |
| 2012/0217421 A1 | 8/2012 | Fujimura et al. | |
| 2013/0283219 A1 | 10/2013 | Fujimura et al. | |

OTHER PUBLICATIONS

Hans Loeschner, "MBMW (Multi-Beam Mask Writer) Development for the 11nm HP Technology Node," NM IMS Nanofabrication, Sematech Symposium Japan Jun. 26, 2012, IMS Nanofabrication AG, Vienna, Austria, http://www.sematech.org/meetings/archives/symposia/10315/Session%201%20-%20Lithog . . . .

* cited by examiner

*Primary Examiner* — Eric Lee
(74) *Attorney, Agent, or Firm* — Haynes and Boone, LLP

(57) ABSTRACT

A system and method that includes receiving a layout of an integrated circuit (IC) device. A template library is provided having a plurality of parameterized shape elements. A curvilinear feature of layout is classified by selecting at least one of the parameterized shape elements that defines the curvilinear feature. A template index is associated with the layout is formed that includes the selected parameterized shape element. The template index and the layout can be delivered to a mask writer, which uses the template index and the layout to fabricate a pattern on a photomask.

20 Claims, 14 Drawing Sheets

| Index | Shape Element Type 702 | Shape Element Parameters 704 | |
|---|---|---|---|
| 1 | Rectangle | Width (w), Height (h) |  |
| 2 | Circle | Radius (a) |  |
| 3 | Ellipse | X-radius (a), Y-radius (b) |  |
| 4 | Ring | Inner radius (a), Outer radius (b) |  |
| 5 | Pie | Radius (a), Start angle ($\phi$), End angle ($\varphi$) |  |
| 6 | Arc | Inner radius (a), Outer radius (b), Start angle ($\phi$), End angle ($\varphi$) |  |
| 7 | Other shape #1 | Point set {p1, p2, ..., pN} | Any point (x, y) within the enclosed shape defined by connecting p1, p2, ..., pN with straight line |
| 8 | Other shape #2 | Point set {p1, p2, ..., pN} | Any point (x, y) within the enclosed shape defined by connecting p1, p2, ..., pN with spline |
| ... | ... | ... | ... |

METHOD AND SYSTEM TO PREPARE, MANUFACTURE AND INSPECT MASK PATTERNS FOR A SEMICONDUCTOR DEVICE

CROSS-REFERENCE TO RELATED APPLICATIONS

This application claims priority to U.S. Provisional Patent Application Ser. No. 62/049,531, filed on Sep. 12, 2014, and entitled "Method And System To Prepare, Manufacture And Inspect Mask Patterns For A Semiconductor Device," the entire disclosure of which is hereby incorporated herein by reference.

BACKGROUND

The semiconductor device industry has experienced rapid growth. In the course of device evolution, the functional density has generally increased while feature size has decreased. This scaling down process generally provides benefits by increasing production efficiency and lowering associated costs. Such scaling down has also increased the complexity of design and manufacturing these devices.

One technique applied to the design and manufacturing of semiconductor devices is optical proximity correction (OPC). OPC includes applying features that will alter the photomask design of the layout of the semiconductor device in order to compensate for distortions caused by diffraction of radiation that occurs during the use of the lithography tools. Thus, OPC provides for producing circuit patterns on a substrate that more closely conform to an semiconductor device designer's (e.g., integrated circuit (IC) designer) layout for the device. OPC includes all resolution enhancement techniques performed with a reticle or photomask including, for example, adding sub-resolution features to the photomask that interact with the original patterns in the physical design, adding features to the original patterns such as "serifs," adding jogs to features in the original pattern, modifying main feature pattern shapes or edges, and other enhancements. As process nodes shrink, OPC processes and the resultant patterns become more complex. One type of advanced OPC is inverse lithography technology (ILT). ILT includes simulating the optical lithography process in the reverse direction, using the desired pattern on the substrate as an input to the simulations. The ILT process may produce complex, non-linear patterns that can be difficult, time consuming, and costly to form on a photomask or reticle.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a table view of an embodiment of a library of shape elements, in accordance with some embodiments.

FIG. 8 is a table view of an embodiment of a library of affine transformations, in accordance with some embodiments.

DETAILED DESCRIPTION

Figure 1:
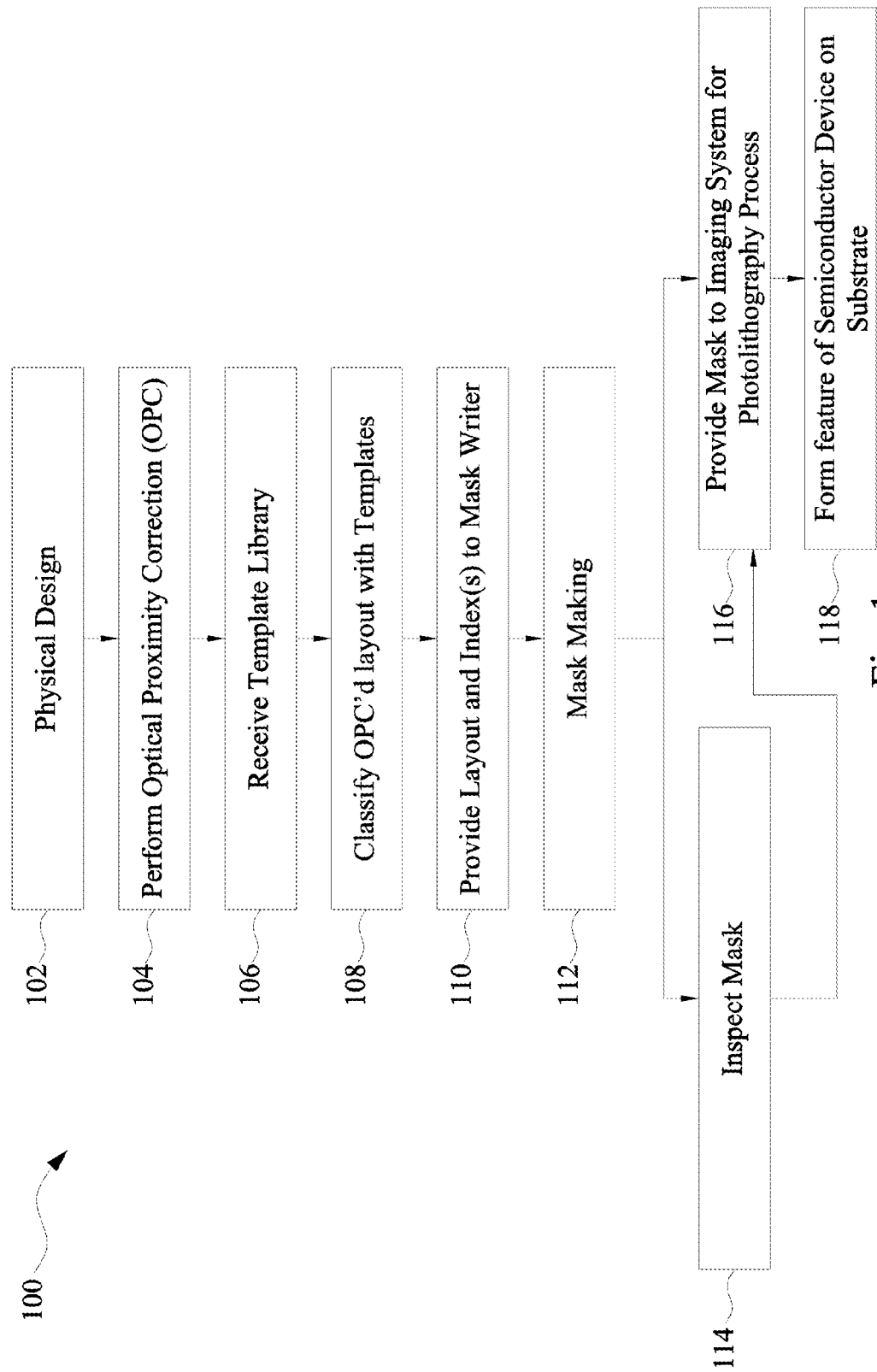
FIG. 1 is a flow chart of an embodiment of a method of semiconductor device design and fabrication, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that provided herein are mask data preparation and mask fabrication systems that provide for the implementation of advanced methods including ILT, source mask optimization, and other optical proximity correction techniques. These techniques may provide for complex mask patterns for fabricating a semiconductor device, such as an integrated circuit (IC), micro-electro-mechanical system (MEMS), light emitting diodes (LED), and/or other semiconductor devices. The patterns discussed and illustrated herein are exemplary only and the mask data is not constrained to any type of feature (e.g., contact, conductive line, diffusion region, etc) or any type of device. As discussed below, one or more aspects of the data preparation may not even be required to be used in mask formation, but applied to other lithography methods used to define and fabricate a semiconductor device (e.g., maskless lithography).

Referring now to FIG. 1, illustrated is a method 100 of preparing mask data, manufacturing a mask (or photomask or reticle) according to said data, and/or inspecting a mask according to said data. The method 100, as discussed below, implements the use of a template library and template index to classify and define design features for use in mask data preparation, mask fabrication, and/or mask inspection. The term classify or classification as used herein includes determining and/or defining a shape element to represent, define or otherwise specify a feature (or portion thereof) in a layout. The classification can determine, define, represent or otherwise specify a feature's shape, profile, contour, edge, size, location, quantity and/or other aspects of a geometric feature of a layout.

The method 100 begins at block 102 where physical design of a semiconductor device is performed. The physical design may be of an integrated circuit (IC). In some examples, the physical design may include LED, MEMS, printed circuit boards (PCB), or other suitable devices. The physical design may be provided after one or more circuit design steps. During the physical design the features (e.g., devices and interconnections thereto) of the circuit design are converted into a geometric representation of shapes, typically called a layout. The physical design of block 102 may include a number of steps such as, developing netlist; floorplanning; partitioning; clock tree synthesis; placement; routing; timing closure steps; verification steps such as layout-versus-schematic (LVS), design rule checking (DRC); design for manufacturability (DFM) steps; and/or other suitable processes. The physical design of block 102 may use a library such as a standard cell library, use fully-custom design, use semi-custom design, and/or use other design methodologies.

During block 102, a layout is generated. The layout may be in various file formats and defines the design of, for example, the integrated circuit. In an embodiment, the layout is in a GDS (e.g., GDSII) file format. In another embodiment, the layout is in an OASIS file format. In yet another embodiment, the layout is in a DFII file format. The layout however may be in other formats, now known or later developed. The layout provides a plurality of main features, features that are to be imaged onto layer(s) on a semiconductor substrate when fabricating the semiconductor device. The main features may be include, for example, gate features, source/drain features, capacitor plates, diffusion regions, conductive lines, vias, contacts, and/or various other semiconductor features including features typical of devices formed using complementary metal oxide semiconductor (CMOS) processes.

The method 100 then proceeds to block 104 where an optical proximity correction (OPC) process is performed on the layout output from the physical design, discussed above with reference to block 102. Block 104 is a computer implemented system. Specifically, block 104 is implemented by an electronic design automation (EDA) tool having a computational lithography platform. The computational lithography platform may include, for example, inverse lithography technology (ILT), model based OPC (e.g., assist features), source mask optimization (SMO), and/or other computational lithography platforms now known or later developed. An exemplary EDA tool is "Inverse Explorer" from Synopsys of Mountain View, Calif. It is typical for the computational lithography of the OPC tool to utilize more than one processor to distribute the extensive computational processes.

In block 104, various OPC models are received and/or stored by the EDA tool and used during performing the OPC process in block 104. The OPC model(s) may correspond with a type of lithography tool to be used in the fabrication of the design represented by the received layout, lithography process parameters (e.g., DOF), the type of photoresist to be used in the fabrication design process, other fabrication aspects of the semiconductor device or the photomask itself, device design requirements, layout based requirements such as consideration of dense or isolated features, and/or other aspects of photomask and/or semiconductor device design and/or fabrication.

Block 104 of the method 100 modifies the layout of the semiconductor device to an OPC'd layout. The OPC'd layout resulting from advanced OPC processes such as discussed above typically provides curvilinear (e.g., non-linear) mask layout features. A curvilinear feature may include a feature having at least one edge that is defined by a curved line. The curvilinear features may be desired such that it can be used to accurately reproduce the desired layout (produced in physical design) onto the substrate during fabrication of the semiconductor device. The OPC'd layout includes the main features of the design, described above with reference to block 102. The OPC'd layout further includes features added, changed, or otherwise affected by the OPC process. For example, the OPC'd layout may include assist features, jogs, serifs, main features having modified shapes to preserve fidelity between the physical design and the imaged feature on the semiconductor wafer, and/or other features provided by OPC processes.

Figure 9:
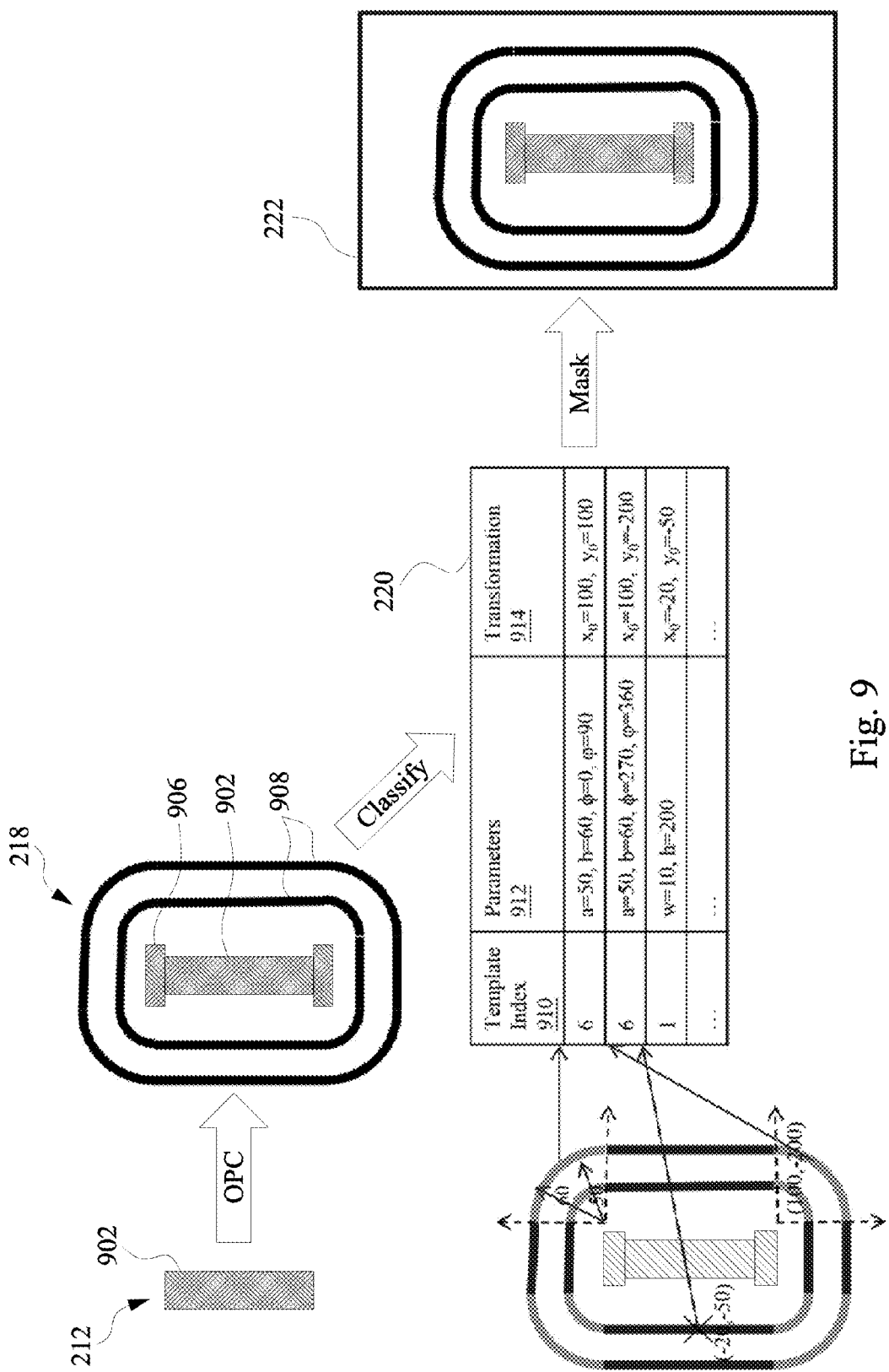
FIG. 9 is a block diagram of one embodiment of designing and defining a feature of a semiconductor device using a template index, in accordance with some embodiments.
Figure 10:
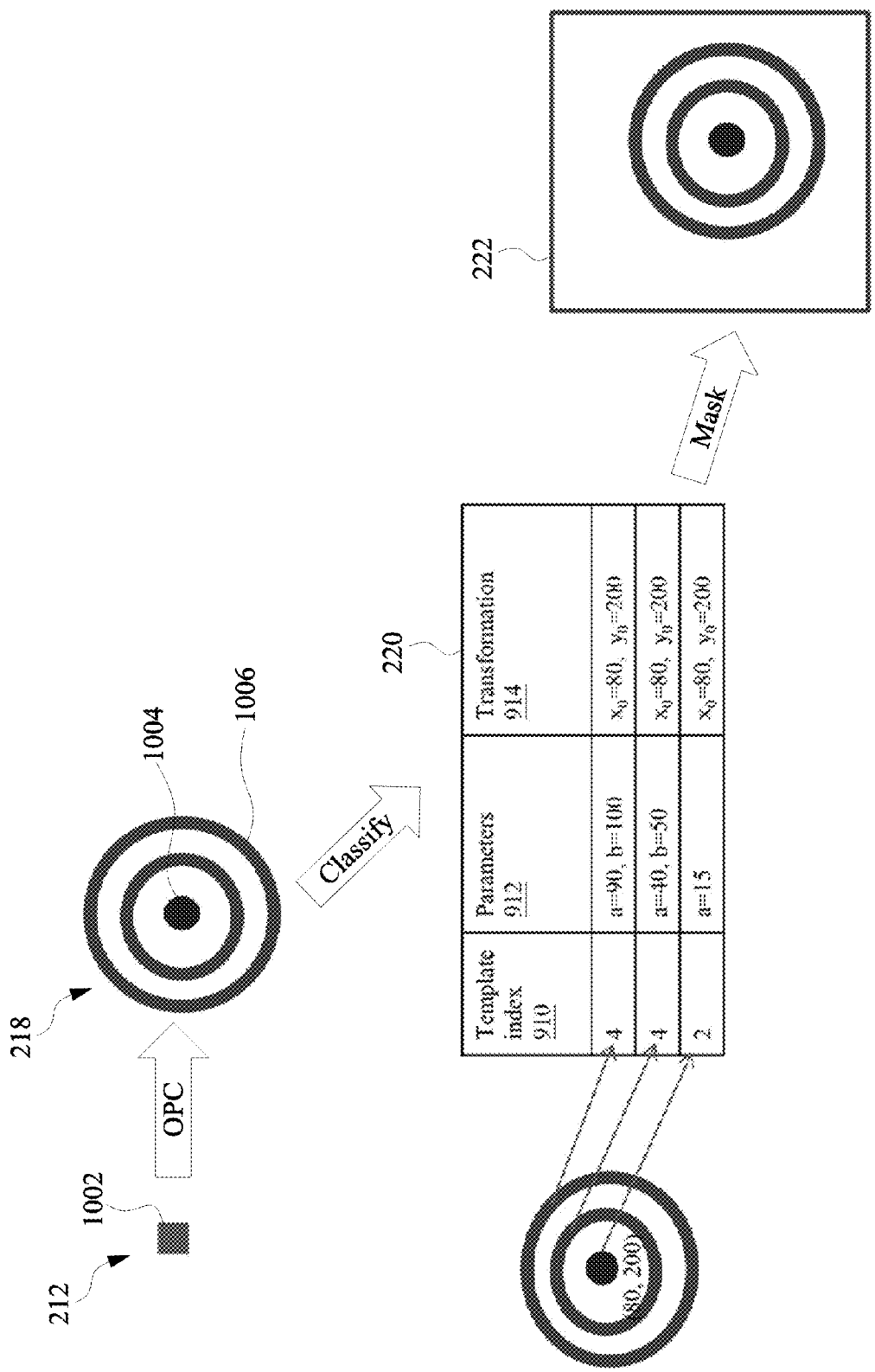
FIG. 10 is a block diagram of another embodiment of designing and defining a feature of a semiconductor device using a template index, in accordance with some embodiments.

Referring to the examples of FIGS. 9 and 10, a main feature such as provided by a layout from the physical design step described in block 102 is illustrated as a layout 212 having a main feature 902 and a layout 212 having a main feature 1002 in FIGS. 9 and 10 respectively. Referring to FIG. 9, after OPC, such as described above with reference to block 104 of the method 100, the layout 212 is modified to provide the OPC'd layout 218 having the main feature 902 with serifs 906 and assist features 908. As illustrated in FIG. 9, the assist features 908 are curvilinear (e.g., two rings). Referring to FIG. 10, after OPC, such as described above with reference to block 104 of the method 100, the layout 212 is modified to provide the OPC'd layout 218 having the modified main feature 1004 and assist features 1006. As illustrated in FIG. 10, the main feature 1004 and the assist features 1006 are curvilinear (e.g., two rings).

After block 104 of the method 100 where an OPC'd layout (also referred to herein as an idealized layout) is provided, the method proceeds to block 106 where a template library is received. The template library may be generated using a method 600, described below with reference to FIG. 6. In an embodiment, the template library is stored on a computer readable medium, for example as non-transitory, computer readable storage medium. The template library may be stored within the OPC tool, or within another system operable to be accessed by the OPC tool.

As discussed below with reference to FIGS. 6, 7, and 8, the template library includes a plurality of parameterized shape elements. In some embodiments, the template library also includes affine transformation functions to be used in conjunction with the parameterized shape elements. FIG. 7 is illustrative of a library 700 including a plurality of shapes elements 702 each having parameters 704. The library includes a mathematical description of the shape element; the parameters 704 are aspects that define the shape elements where a value of the description may be later defined or selected. While the drawn features are illustrated for convenience at the right side of the table, the library 700 may not store such a pictorial representation.

Figure 8:
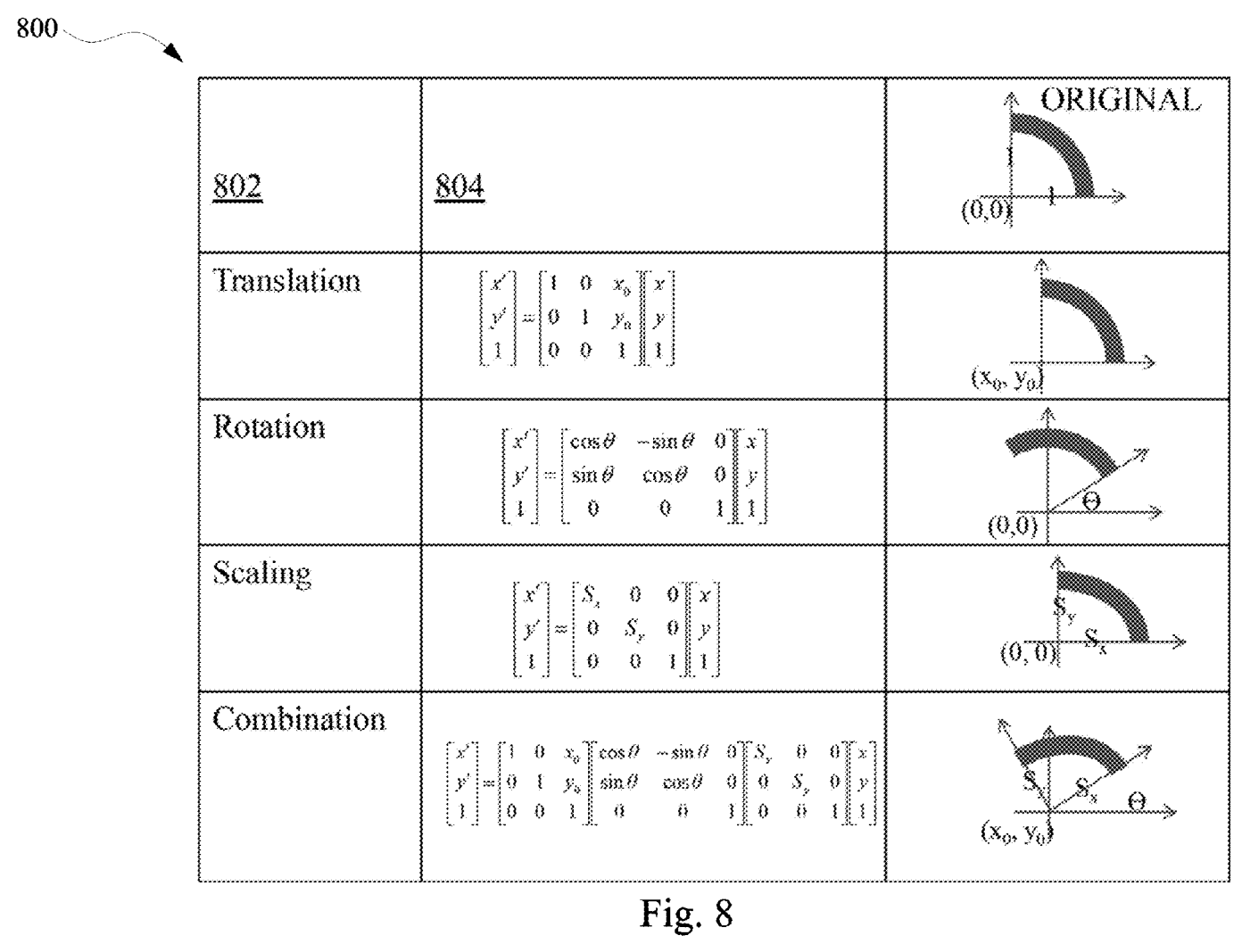

FIG. 8 is illustrative of stored affine transformation definition 800 also referred to as a library. The affine transformation definition 800 may be included in the library received in block 106, or may be stored within the OPC and/or classification system, described below. The affine transformation definition 800 may be stored with the library 700. The affine transformations may provide a manner in which to relate two or more features such as, translation, rotation, scaling, and/or a combination thereof. The affine transformations 800 provide the relationship 802 and the mathematical relationship 804 defined by variables that are later defined or selected. Like the template library of FIG. 7, the affine transformation definition 800 includes a pictorial representation that may be provided for illustrative purposes only and not intended to be required in its implementation. The affine transformations 800 are used to position the selected shape elements of the library 700 at the proper position corresponding to the layout (e.g., vertical position, horizontal position, rotation, etc). This is illustrated in FIGS. 9 and 10.

The method 100 then proceeds to block 108 where the OPC output, the OPC'd layout, is classified using the template library. It is noted that block 108 may be provided using the same processor as the OPC process of block 104. The classification of block 108 may include assigning one or more shape elements from the template library to represent a given feature on the OPC'd layout. Any number of shape elements from the library may be used to represent a given feature on the OPC'd layout. The classification of block 108 may also include using one or more selected affine transformations to define the given feature of the OPC'd layout in conjunction with the shape element of the library. The classification may be performed on the OPC features (e.g., assist features), the main features, or a combination thereof.

Referring again to the example of FIG. 9, the OPC'd layout 218 is classified using the template library, such as, the template library 700 of FIG. 7. As illustrated in FIG. 9, the OPC'd layout 218 assist features 908 are classified using a plurality of shape elements from the template library. Specifically, the assist features 908 (e.g., two circulinear rings) may be represented by 8 rectangle shape elements and 8 arc shape elements. The main feature 902 (including serif 906) may be represented by 3 rectangle shape elements. The resulting classification is stored in a template index 220. The template index 220 includes a reference number 910 to the library entry, an assignment of the value for each parameter of the defined library shape element 912, and a value for the variables of a selected affine transformation 914. The selected affine transformation 914 and its value properly position the selected shape element so that it properly defines the layout. The template index 220 is exemplary only and not intended to be limiting in format except as specifically recited in the claims that follow. Any number of features of a layout may be classified by a given template index 220. In some embodiments of the method 100, the main feature (e.g., 902, 906) is classified and stored in the template index 220. In other embodiments, assist features (e.g., 908) are classified and one or more main features are not.

Referring again to the example of FIG. 10, the OPC'd layout 218 is classified using the template library, such as the template library 700 of FIG. 7. As illustrated in FIG. 10, the OPC'd layout 218 assist features 1006 are classified into a plurality of shape elements of the template library. Specifically, the assist features 1006 (e.g., two circulinear rings) may be represented by 2 ring shape elements. The modified main feature 1004 may be represented by 1 circle shape element. The classification is stored in the template index 220. The template index 220 may be substantially similar to as discussed above with reference to FIG. 9. It is noted that FIG. 10 is illustrative of a main feature being classified and stored in a template index.

Figure 11:
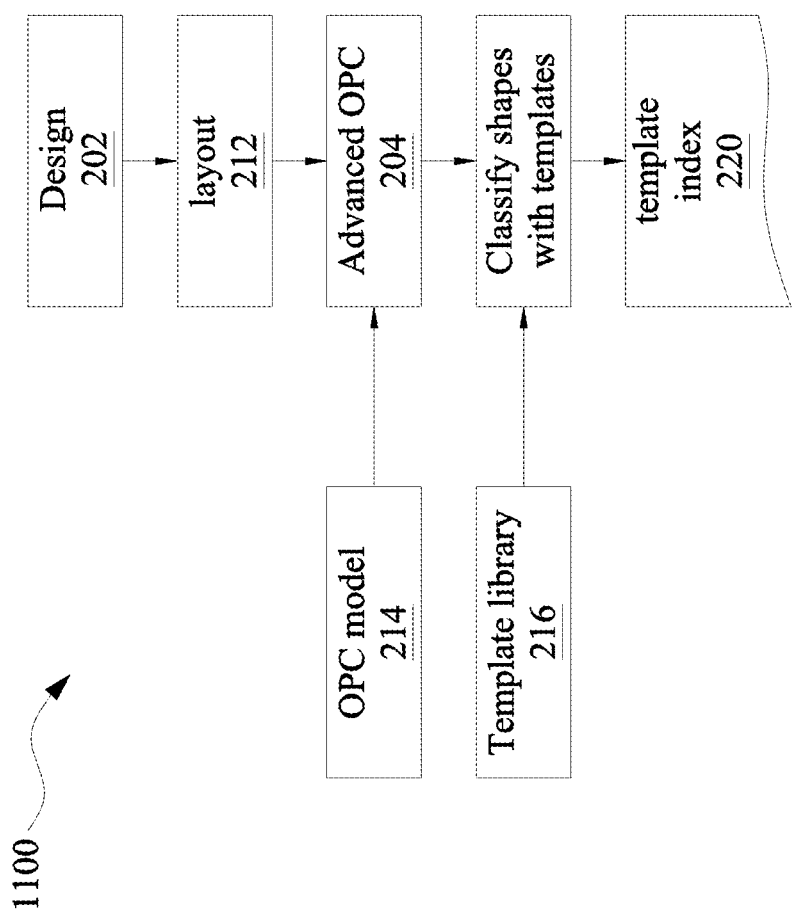
FIGS. 11, 12, 13, and 14 illustrate block diagrams providing for some embodiments implementing aspects of the method of FIG. 1 and/or system of FIG. 2.
Figure 12:
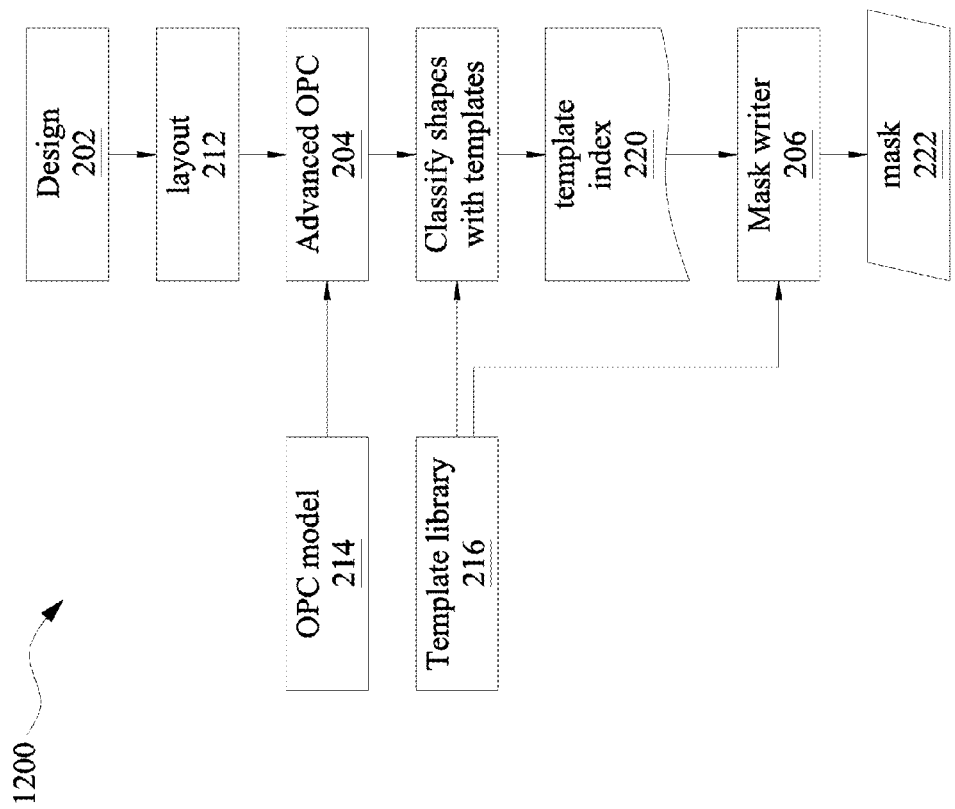
Figure 13:
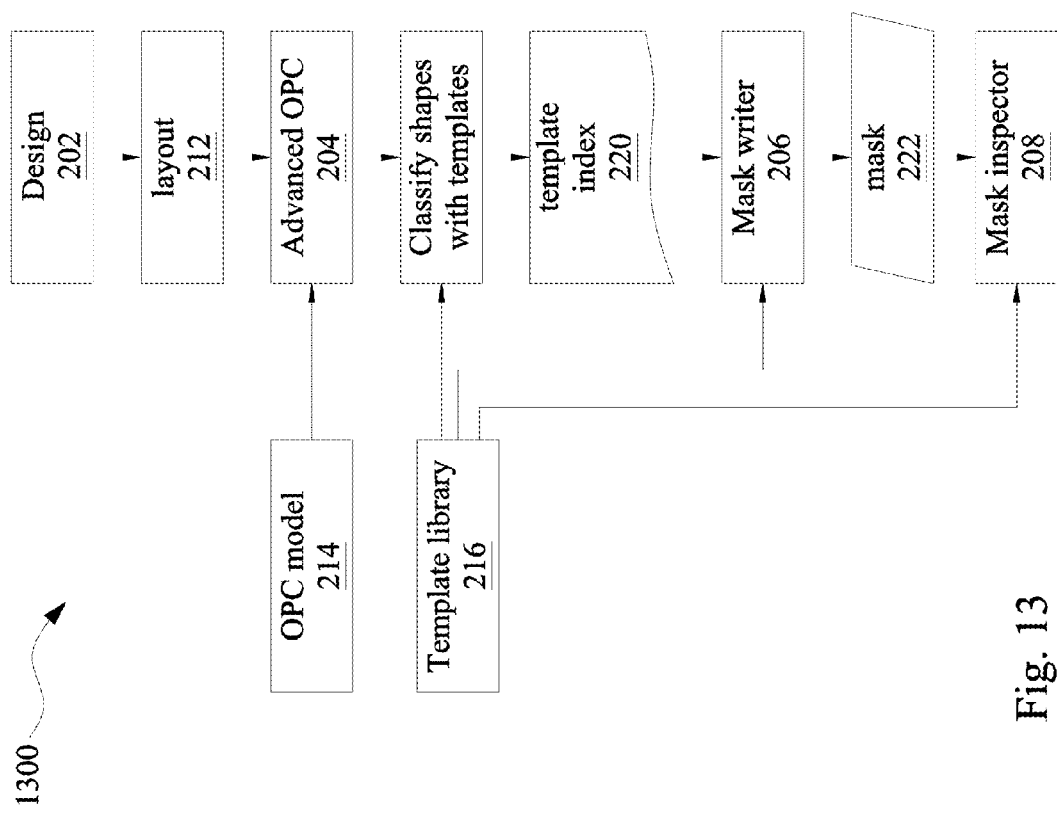
Figure 14:
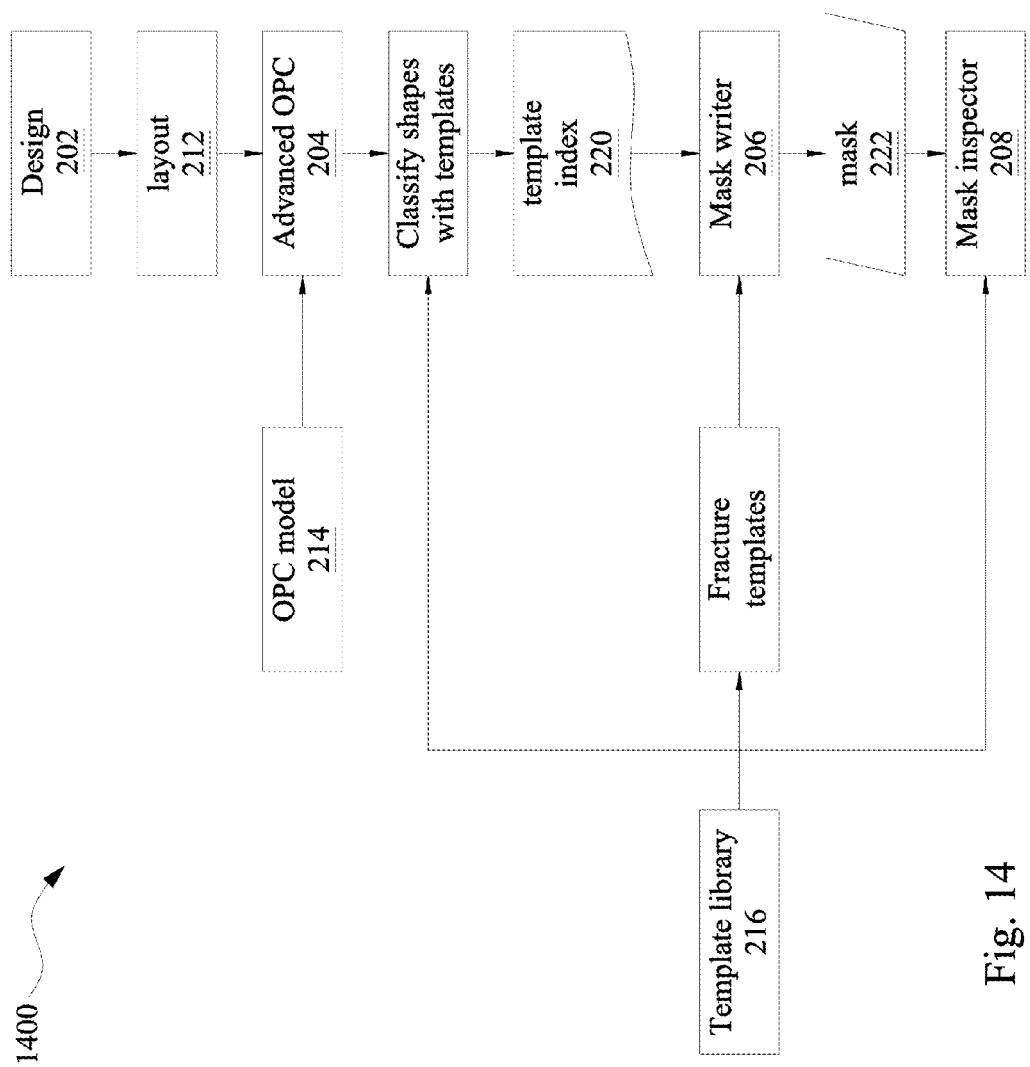

In an embodiment, the template index, such as the index 220 of FIGS. 9 and 10, is a complementary file to the layout file or OPC'd layout, e.g., GDSII or OASIS file. In another embodiment, the template index is an extension included within the layout file generated by the OPC tool, e.g., embedded within the GDSII or OASIS file. In either manner, in an embodiment, the template index is generated along with the OPC'd layout file and also output from the OPC tool, see, e.g., FIG. 11 below. In some embodiments, a plurality of template indexes are formed for a given OPC'd layout, for example, for layers of the layout, for regions of the layout, for specific features of the layout In some embodiments, the OPC output is provided to a converter (such as a mask data preparation tool) that modifies produced pattern such that it is represented by a set overlapping rectangles that approximate the computed features of the OPC'd layout. This mask data preparation may be performed by a mask writer, examples of which are described below. In an embodiment, a curvilinear feature determined by the OPC tool may be modified (e.g., fractured) such that it is represented by a set of (overlapping) rectangles to form a fractured layout. The fractured layout is then provided for mask masking processes. While this modification of the OPC'd layout may be suitable in some respects and some embodiments, it also provides for disadvantages. For example, the actual intended shape of OPC feature is "lost" in the fracturing. As another example, the fracturing may be costly in terms of time, computational bandwidth, file size, and/or other aspects. The template index may serve to alleviate or reduce some of these disadvantages by being communicated to subsequent processes such as the mask making tool, this is discussed below.

The method 100 then proceeds to block 110 where the OPC'd layout and/or the template index(es) are provided to the mask writer. In an embodiment, the OPC'd layout and/or template index(es) are provided in a mask writer format, such as a machine readable format. As discussed above, in an embodiment, the OPC'd layout provided to the mask writer includes one or more curvilinear features. The data provided to and/or used by the mask writer may be stored on a non-transitory storage medium.

The mask writer of block 110 may be an e-beam mask writer. In an embodiment, the e-beam mask writer is a multi-beam e-beam writer. Other exemplary e-beam writers include variable shaped beam writers, Gaussian beam, character projection, and/or other suitable e-beam writer tools. In other embodiments, the mask writer may be a laser writer. Referring to the example of FIG. 9, the template index 220 is delivered to a mask writer. The OPC'd layout 218 may also be delivered to the mask writer. Referring to the example of FIG. 10, the template index 220 is delivered to a mask writer. The OPC'd layout 218 may also be delivered to the mask writer.

The method 100 then proceeds to block 112 where the mask (also referred to as a photomask or reticle) is fabricated. The mask writer described above may be used to form a geometric pattern corresponding to the OPC'd layout. (It is noted that some features of the OPC'd layout, such as the assist features, may be sub-resolution. Thus, though they are formed on the photomask, they are not formed on the target substrate during the imaging.) The mask writer, such as an e-beam writer, projects one or more beams of electrons through a stencil onto a mask (blank having a photosensitive layer) to form a mask image reflecting the patterns on the OPC'd layout. One exemplary mask writer is provided in FIG. 4.

In an embodiment, the mask writer uses the index template (e.g., 220) to define the shapes that are drawn on the mask using, for example, the multiple electronic beams. In an embodiment, the mask writer uses the OPC'd layout in conjunction with the index template to define the shapes that are drawn on the mask using, for example, the multiple electronic beams. In an embodiment, the use of the index template may decrease the process time for the mask writer because the intent of the shape is provided by the index template. For example, the mask writer would know that it is desired to write a given shape, e.g., a ring shape. The mask writer could (a) rasterize the shape (e.g., ring) for a multi-beam writer or (b) replace the shape (e.g., ring) with a set of pre-optimized shot(s) for a shape-based writer.

Referring to the example of FIG. 9, a photomask 222 is illustrated having features corresponding to the OPC'd layout 218 and defined by the index template 220. Referring to the example of FIG. 10, a photomask 222 is illustrated having features corresponding to the OPC'd layout 218 and defined by the template index 220.

The mask fabricated in block 112 may include a substrate upon which patterns are etched and/or materials disposed thereon are patterned to reflect the OPC'd layout. The mask may be a binary mask, a phase shift mask (PSM), an extreme ultraviolet lithograph (EUVL) mask, and/or other suitable mask. In an embodiment, the mask includes transparent substrate (e.g., quartz) and an opaque material (e.g., chromium). Exemplary PSM may include attenuated PSM, alternating PMS, and/or other phase shift mask technologies. Exemplary EUL masks may include a substrate (e.g., quartz, a low-thermal expansion material (LTEM)) having various multilayers and absorption layers formed thereon. Various other mask technologies now known or later developed may also benefit from aspects of the present disclosure.

After various processing steps, the completed mask may then be used in an optical lithography imaging system, as illustrated in block 116. One example of an imaging system is provided in FIG. 5. The imaging system exposes a photosensitive material (e.g., resist) coated target semiconductor substrate, such as a silicon wafer, to create an image on the resist. The target substrate may be any suitable elementary semiconductor, compound semiconductor, alloy semiconductor. The target substrate, along with the photosensitive layer, may further include various features used for fabricating semiconductor devices such as, for example, various doped regions, dielectric features, conductive features including multi-level interconnects, gate features, and the like. These materials and processes are typical of CMOS process technology and thus, not described in detail herein.

The method 100 then proceeds to block 118 where the exposed substrate is processed in additional steps such as baking and development to create a pattern on the substrate. Again, these materials and processes can use those of CMOS process technology and thus, not described in detail herein.

Alternatively or additionally, after the mask is fabricated in block 112, the method 100 may include the block 114 where the mask is inspected. The inspection may include an inspection for visible defects, dimensional compliance, and/or other defects. The inspection may be performed by automated inspection system that can detect defects of a few microns or less. In an embodiment, the inspection includes the use of scanning electron microscopy. In some embodiments, light-based microscope systems are operable to provide an indication of bright and dark field illumination that can recognize defects in a mask. One example of an inspection tool is provided by Carl Zeiss SMT GmbH, of Germany. The inspection of block 114 may further include mask rule checks.

The inspection of block 114 may include a comparison of the fabricated mask with the layout data, and in particular a comparison of the mask data or fabricated mask with the template index and/or library, described above at blocks 110 and 106 respectively. In an embodiment, a template index may have an accompanying map that indicates the relative importance of a given feature (e.g., shape), indicates how the inspection tool should inspect different portions, indicates inspection settings or parameters, and/or provides other inspection criteria.

Figure 2:
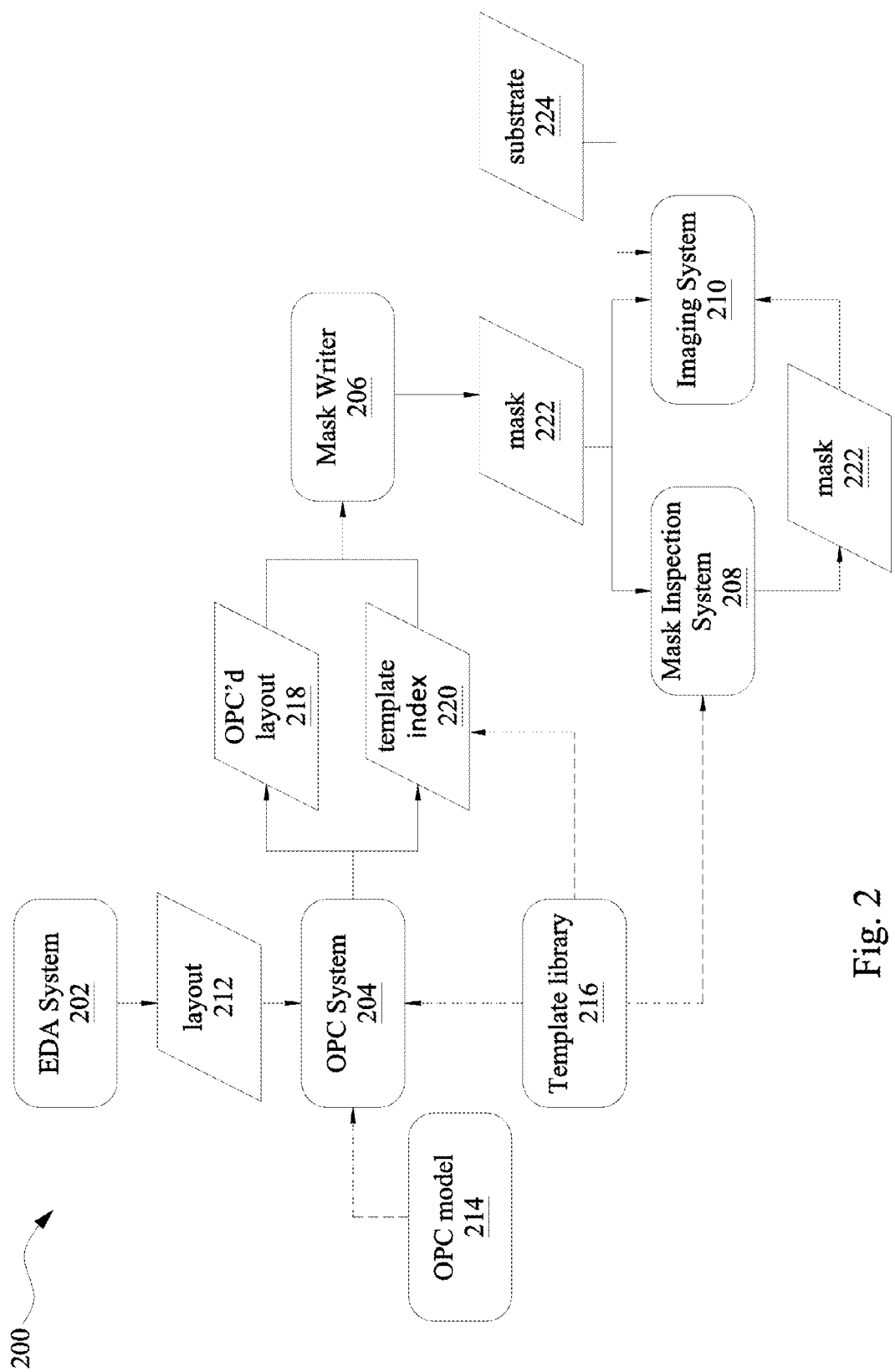
FIG. 2 is a block diagram of an embodiment of a plurality of systems operable to design and fabricate semiconductor devices, in accordance with some embodiments.

Referring now to FIG. 2, illustrated is a block diagram of a system 200 that provides for preparing mask data, manufacturing a mask (or photomask or reticle) according to said data, and/or inspecting a mask according to said data, according to one or more aspects of the present disclosure. The system 200, as discussed below, implements the production and/or use of a template library and template index to classify and define design features for use in mask data preparation, mask fabrication, and/or mask inspection.

The system 200 includes an electronic design system 202, an OPC system 204, a mask writer 306, a mask inspection system 208 and an imaging system 210. In an embodiment, the system 200 implements the method 100, described above with reference to FIG. 1.

The EDA system 202 of the system 200 includes electronic tools for designing semiconductor devices such as integrated circuits. The tools allow for the design, analysis and verification of designs of semiconductor devices. The EDA tools may include process such as synthesis, schematic capture, simulations, production of a layout, and various other steps of semiconductor device design. In particular, the physical design component of the EDA tools provides for converting a circuit design (e.g., schematic) into a geometric representation of shapes, typically called a layout. Thus, output from the EDA system 202 is a layout 212. The layout 212 may be in various file formats and define the design of, for example, the integrated circuit. In an embodiment, the layout 212 is a GDS (e.g., GDSII) file format. In another embodiment, the layout 212 is an OASIS file format. In yet another embodiment, the layout is in a DFII file format. Other layout formats now known or later developed are all possible. The layout 212 provides geometric shapes representing a plurality of main features, those features that are to be imaged onto layer(s) on a semiconductor substrate when fabricating the semiconductor device. The main features may be include, for example, gate features, source/drain features, capacitor plates, diffusion regions, conductive lines, vias, contacts, and/or various other semiconductor features including features typical of devices formed using complementary metal oxide semiconductor (CMOS) processes.

The layout 212 is provided to the OPC system 204. Also received and/or stored within, the OPC system 204 are one or more OPC models 214. The OPC system 204 is an EDA tool having computational lithography program therein. The computational lithography platform may include, for example, inverse lithography technology (ILT), model based OPC (e.g., assist features), source mask optimization (SMO), and/or other platforms. An example some of the functionality of the OPC system 204 described herein includes "Inverse Explorer" from Synopsys of Mountain View, Calif. It is typical for the computational lithography of the OPC tool to utilize more than one processor to distribute the extensive computational processes. The OPC model(s) 214 may correspond with a type of lithography tool to be used in the fabrication of the design represented by the received layout. The OPC model(s) 214 may correspond with a type of lithography tool to be used in the fabrication of the design represented by the received layout, lithography process parameters (e.g., DOF), the type of photoresist to be used in the fabrication design process, other fabrication aspects of the semiconductor device or the photomask itself, device design requirements, layout based requirements such as consideration of dense or isolated features, and/or other aspects of photomask and/or semiconductor device design and/or fabrication.

The OPC system 204 develops and outputs a layout 218, referred to herein as an OPC'd layout (a layout post-OPC processing, or layout upon which OPC has been ran and features implemented). The OPC'd layout 218 provides curvilinear layout features. The OPC'd layout 218 includes the main features of the design as well as OPC features added, changed, or otherwise affected by the OPC process. For example, the OPC'd layout 218 may include assist features, jogs, serifs, main features having modified shapes to preserve fidelity between the physical design and the imaged feature on the semiconductor wafer and/or other features provided by OPC processes.

In an embodiment, the OPC system 204 also receives a template library 216. The template library 216 may be substantially similar to the library discussed above with reference to block 106 of the method 100 of FIG. 1, and the libraries of FIGS. 9 and 10. The template library may be generated using a method 500, described below with reference to FIG. 5. In an embodiment, the template library is stored on a computer readable medium, for example as non-transitory, computer readable storage medium. This is discussed further below with reference to FIG. 3. The template library 216 includes a plurality of parameterized shapes. In some embodiments, the template library includes affine transformation functions operable to act upon the parameterized shapes. Again, this is discussed in further detail with respect to FIGS. 1, 7, 8, 9 and 10.

In an embodiment, the OPC system 204 uses the template library 216, including a shape element and/or affine transformation library, to classify the OPC'd layout generated by the OPC system 204 using the template library of shape elements and affine transformations. The classification is discussed above with reference to FIGS. 1, 6, 7, 8, 9 and 10. The classification may include assigning one or more elements (e.g., shapes) from the template library to represent a given feature (e.g., shape) on the OPC'd layout. Any number of library elements may be used to represent a given feature on the OPC'd layout. The classification produces a template index 220, which may be stored in the OPC system. The template index 220 includes a definition of various shape indexes and/or transformations and values for referenced parameters. An example template index 220 is provided in FIGS. 9 and 10 respectively. Thus, the OPC system 204 outputs the OPC'd layout 218 and the template index 220.

As discussed above, in an embodiment the OPC system 204 provides the template index 220. In other embodiments, a system separate and distinct from the OPC system 204 may be programmed with functionality that provides for the template index 220. Whether the template index is produced by the OPC system 220 or another EDA system, FIG. 3 provides an embodiment of aspects of such as system.

Figure 3:
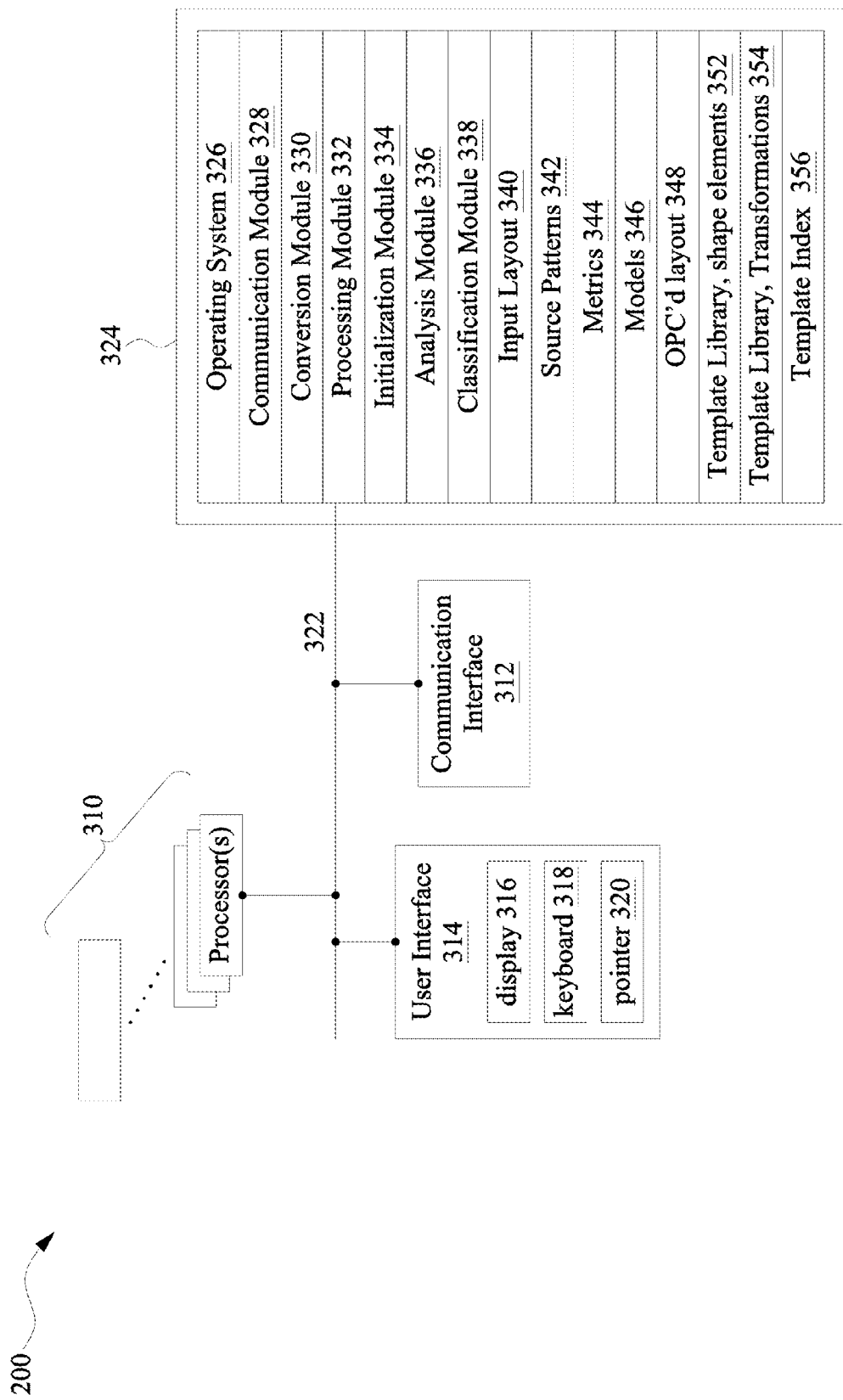
FIG. 3 is a block diagram of a design system that may be used in accordance with some embodiments.

Referring now to FIG. 3, illustrated is a system 300. In an embodiment, the system 300 is a specialized computer system 300 for performing one or more functions described herein. The system 300 may include an OPC system substantially as discussed above with reference to OPC system 204 of the system 200, and/or as discussed with reference to block 104 of the method 100 of FIG. 1. The system 300 includes one or more processors 310 or processor cores, a communication interface 312, a user interface 314, and one or more signal lines 322 coupling these components together. Note that the processing unit(s) 310 support parallel processing and/or multi-threaded operation, the communication interface 312 may have a persistent communication connection, and the one or more signal lines 322 may constitute a communication bus. Moreover, the user interface 314 may include: a display 316, a keyboard 318, and/or a pointer 320, such as a mouse. The user interface 314 may provide control of the system by a designer such as an IC designer.

Memory 324 in the system 300 may include volatile memory and/or non-volatile memory. More specifically, memory 324 may include: ROM, RAM, EPROM, EEPROM, flash memory, one or more smart cards, one or more magnetic disc storage devices, and/or one or more optical storage devices. Memory 324 may store an operating system 326 that includes procedures (or a set of instructions) for handling various basic system services for performing hardware dependent tasks. The memory 324 may also store communications procedures (or a set of instructions) in a communication module 328. The communication procedures may be used for communicating with one or more computers, devices and/or servers, including computers, devices and/or servers that are remotely located with respect to the system 300. In an embodiment, the communication may be with other mask data preparation systems. Memory 324 may also include one or more program modules (or sets of instructions), including: conversion module 330 (or a set of instructions), processing module 332 (or a set of instructions), initialization module 334 (or a set of instructions), analysis module 336 (or a set of instructions), and a classification module 338 (or set of instructions). Moreover, one or more of these program modules may constitute a computer-program mechanism.

Conversion module 330 may convert an initial file format to a format suitable for processing. For example, one or more layout(s) or target patterns (such as in the case of ILT processing) may be converted to a different format, such as bitmap or grayscale. The processing module 332 may divide the analysis up into overlapping work units, at least some of which can be processed in parallel by processors 310.

Initialization module 334 may receive an initial layout 340 (e.g., layout 212, described above with reference to FIG. 2), and/or source patterns 342 such as provided in an ILT process. The processors then work to perform iterative processes to form various OPC'd layouts 348 based on various metrics 344 and models 344, for example, directed to optical paths, photoresist characterization, process conditions in a photolithographic process, and the like. The models 344 may be substantially as discussed above with reference to OPC model 214. The analysis module 336 generates the iterative OPC'd layouts 348 using a process, such as an ILT calculation.

The system 300 also includes a classification module 338. The classification module 338 receives the finally determined OPC'd layout 348. The classification module 338 then works using one or more of the processors 310 to classify the OPC'd layout 348. The classification uses the template library 352/354 to define one or more features of the OPC'd layout. This classification is illustrated and described above, including in FIGS. 9 and 10.

Figure 6:
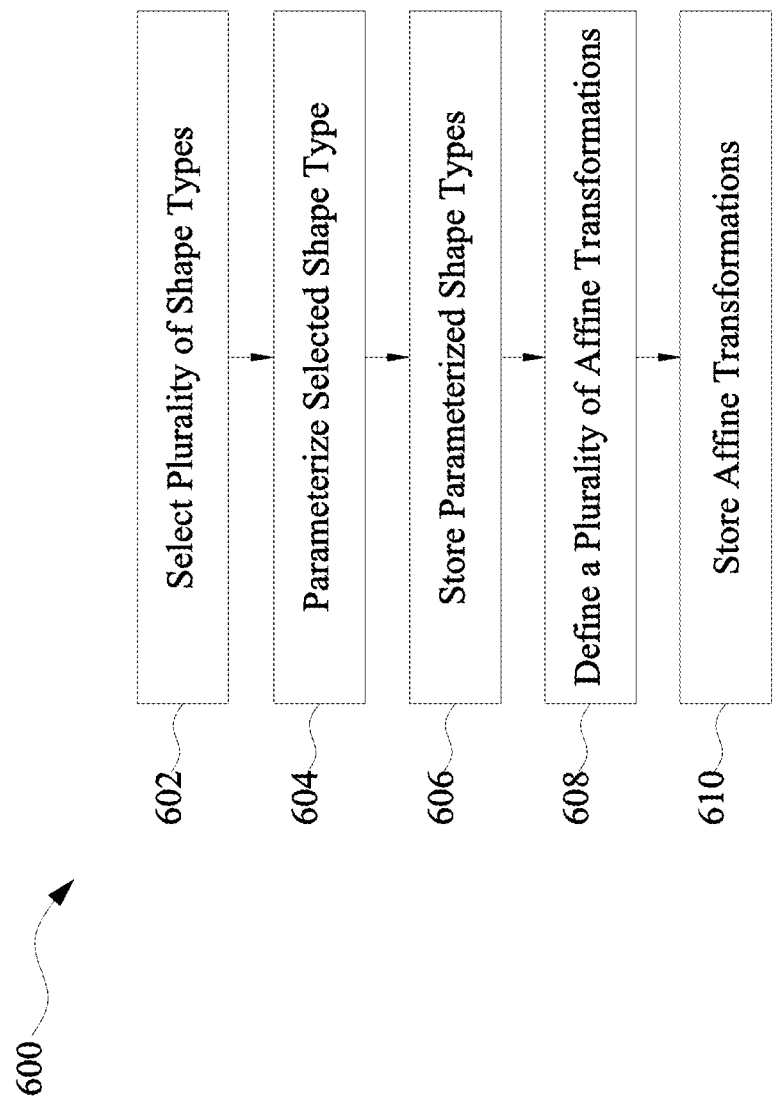
FIG. 6 is a flow chart of an embodiment of a method of preparing a template library, in accordance with some embodiments.

An exemplary embodiment of producing the template library 352 having shape elements is provided in illustrated in FIG. 6. The template library 352 includes a plurality of elements that define shape elements using parameterized values. The template library 352 may include any number of shape elements. An example of a template library 352 is provided as library 700 of FIG. 7. The classification module 338 uses the template library 352 to select a shape element and define a parameterized values associated with the shape element to define features of the OPC'd layout 348. The selected elements and assigned parameter values are stored as a template index 356. Partial examples of a template index 356 are described as template index 220 in FIGS. 9 and 10, respectively.

In addition to the template library 352, the classification module 332 also uses an affine transformation library 354. The affine transformation library 354 may include a plurality of transformation definitions that allow for defining position, rotation, or scale of the selected template library elements described above. An example affine transformation library is illustrated in FIG. 8. The classification module 338 may select one or more affine transformations and assign values for the transformation according to the feature of the OPC'd layout 348. These transformation types and values may be stored in the template index 356. Partial examples of a template index 356 are described as template index 220 in FIGS. 9 and 10, respectively.

Thus, the classification module 332 develops the template index 356 that specifies and stores the affine transformation type(s) and parameter(s) and/or template library element(s) and parameter(s), for one or more features of the OPC'd layout. The template index 356 may be provided embedded within the layout 348 or as a separate data element.

In another embodiment, the template index is produced by portions of the system 300 that are operated by a processor that is separate from that that performs the OPC functions, such as discussed with reference to the OPC system 204. In other words, the OPC layout 218 may be produced by a first system, and the template index 220 may be produced by a separate system receiving the OPC layout 218.

Referring again to FIG. 2, the template index 220 and the OPC'd layout 218 produced by the OPC system 204 (and/or the system 300 of FIG. 3 illustrated as elements 356 and 348 above) are provided to the mask writer 206. The template library 216 may also be provided to and/or stored by the mask writer 206 for ease of implementing the index template. The mask writer 206 may be an electron beam mask writer tool. In a further embodiment, the mask writer 206 may be a multi-beam mask writer tool.

Figure 4:
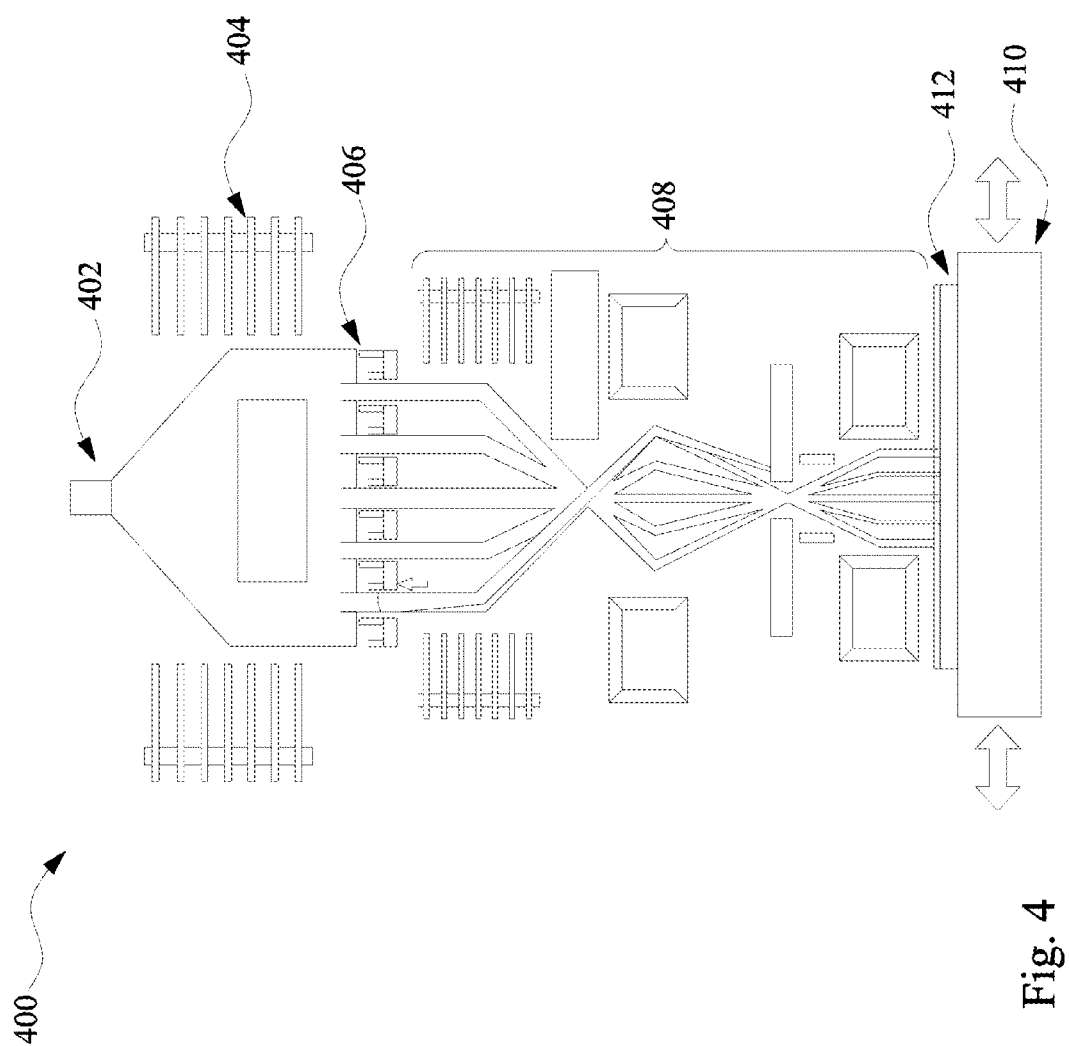
FIG. 4 is a diagrammatic view of a mask writer that may be used in accordance with some embodiments.

An exemplary mask writer is illustrated in FIG. 4, as e-beam writer 400. The e-beam writer 400 may be a multi-beam e-beam writer. The e-beam writer 400 includes an electron source 402, a plurality of condenser optics 404, a stencil or programmable aperture plate system 406, and projection optics 408 including various lens and stopping plate(s). A stage 410 holds a mask 412, which may be a mask blank covered with a photosensitive layer 414. The stage 410 may be operable to scan the mask 412 to provide the beams incident the mask 412. In an embodiment, the programmable aperture plate system 406 includes a blanking plate and an aperture plate.

Referring again to FIG. 2, the mask writer system 206 provides for producing a mask 222 having pattern provided thereon. The mask 222 may have the pattern provided by the OPC'd layout 218 and/or the template index 220 formed thereon. The mask 222 may be a binary mask, a phase shift mask (PSM), an extreme ultraviolet lithograph (EUVL) mask, and/or other suitable mask. Exemplary PSM may include attenuated PSM, alternating PSM, and/or other phase shift mask technologies. Exemplary EUVL masks may include a substrate (e.g., quartz, a low-thermal expansion material (LTEM)) having various multilayers and absorption layers formed thereon. Various other mask technologies may be provided in the mask 222 including as discussed herein.

In some embodiment, the mask 222 is a transmissive mask. For example, the mask 222 may include a transparent substrate having fused quartz ($SiO_2$), calcium fluoride ($CaF_2$), or other suitable material. The mask 222 may further include an absorption layer formed on the transparent substrate and patterned to define the pattern of the OPC'd layout. The absorption layer may include chromium (Cr) and/or MoSi; however, the absorption layer may alternatively include Cr, MoSi, iron oxide, or an inorganic film made with MoSi, ZrSiO, SiN, $MoSiON_x$, and/or TiN. In some embodiments, the absorption layer may have a multilayer structure. For example, the absorption layer may include a layer of Cr film and a layer of MoSi film. The mask may further include patterned features (shifters) formed on/in the substrate to phase-shift a radiation beam passing therethrough. In one embodiment, the shifters may include areas in which the substrate is partially etched such that the radiation beam through these areas has a predefined phase shift, such as about a 180 degree shift relative to areas not etched.

In other embodiments, the mask 222 is a reflective mask used in an extreme ultraviolet (EUV) lithography process and a EUV lithography system. The EUV lithography system has a light source to generate EUV light, such as EUV light having a wavelength centered at about 13.5 nm. The mask 222 may include a substrate made of a low thermal expansion material (LTEM). The LTEM material may include $TiO_2$ doped $SiO_2$, or other material having low thermal expansion. Various multilayers (e.g., Mo/Si pair layers), buffer, and/or absorption layers may be disposed on the LTEM substrate.

As illustrated in the system 200, the mask 222 is provided to at least one of the mask inspection system 208 and an imaging system 210. The mask inspection system 208 may be operable to provide inspection for visible defects, dimensional compliance, and/or other defects. The inspection may be performed by automated inspection systems that can detect defects of a few microns or less. In an embodiment, the inspection includes the use of scanning electron microscopy. In some embodiments, light-based microscope systems are operable to provide an indication of bright and dark field illumination that can recognize defects in the mask. The inspection may include a comparison of the fabricated mask with the layout data (see layout 218), and in particular a comparison of the mask data or fabricated mask with the template index 220 and/or the template library 216. One example of an inspection tool is provided by Carl Zeiss SMT GmbH, of Germany. As illustrated in FIG. 2, the template library 216 may be provided to or stored by the mask inspection system 208 in order to facilitate the comparison of the mask 222 and the template index 220.

Figure 5:
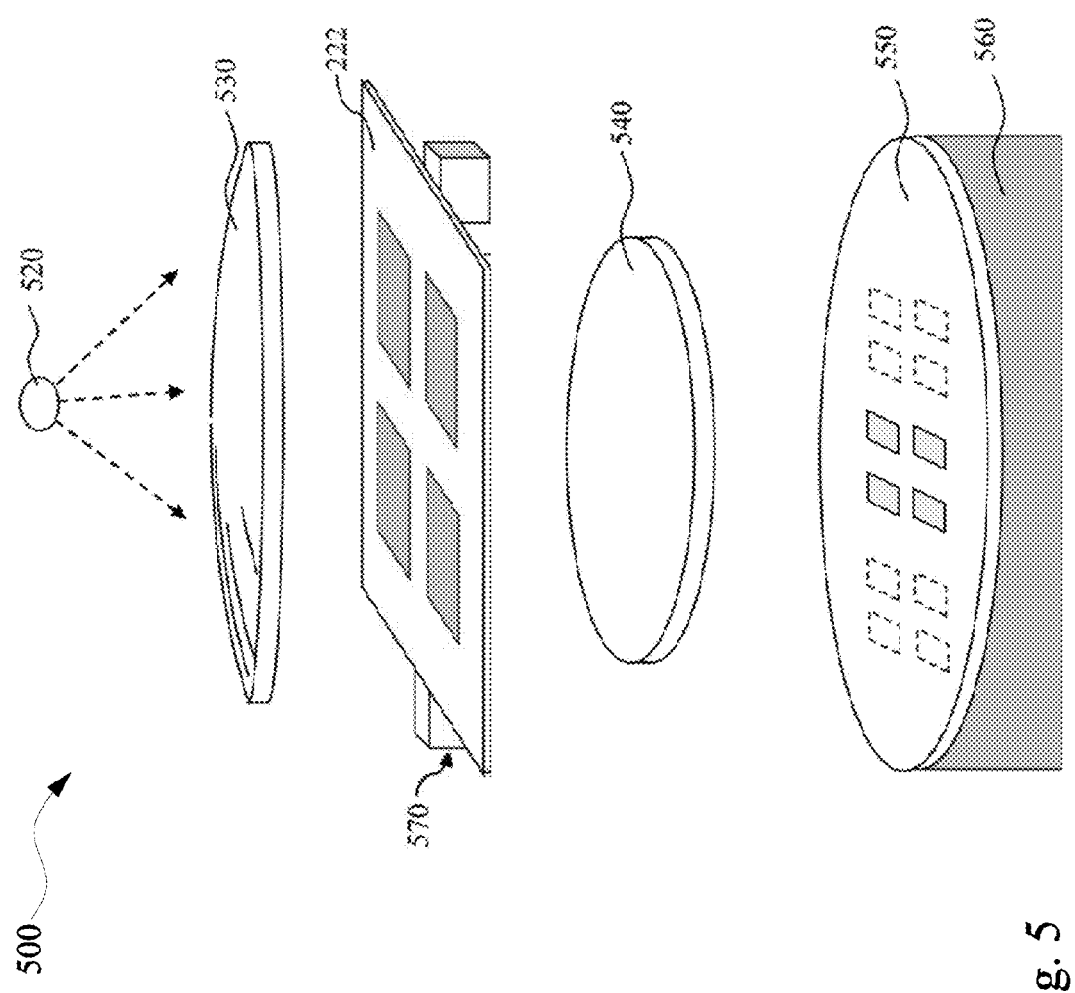
FIG. 5 is an embodiment of an imaging system using in accordance with some embodiments.

An embodiment of the imaging system 210 is illustrated in FIG. 5 as the imaging system 500. The imaging system 500 includes a radiation source (or source) 520 to provide radiation energy. The radiation source 520 may be any suitable light source. In various embodiments, the radiation source may include a light source selected from the group consisting of ultraviolet (UV) source, deep UV (DUV) source, and EUV source. For example, the source 520 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source has a wavelength of about 13.5 nm or less.

The lithography system 500 also includes an optical subsystem that receives the radiation energy from the radiation source 520, modulates the radiation energy by the mask 222 and directs the radiation energy to a resist layer coated on a target substrate 550. In some embodiments, the optical subsystem is designed to have a refractive mechanism. In this situation, the optical subsystem includes various refractive components, such as lenses. The target substrate may be substantially similar to as discussed above with reference to block 118 of the method 100 of FIG. 1.

In some particular embodiments, the lithography system 500 includes an illumination module (e.g., a condenser) 530. The illumination module 530 may include a single lens or a lens module having multiple lenses and/or other lens components. For example, the illumination module 530 may include microlens arrays, shadow masks, and/or other structures designed to aid in directing radiation energy from the radiation source 520 onto the mask 222 that defines the pattern to be transferred to the resist layer 550.

The mask 222 is loaded and secured on a mask stage 560 of the lithography system 500. The mask stage 560 may be designed and configured to be operable for translational and rotational motions.

The lithography system 500 includes a projection module 540. The projection module 540 may have a single lens element or a plurality of lens elements configured to provide proper illumination to the resist layer on a wafer. Each lens element may include a transparent substrate and may further include a plurality of coating layers. The illumination module 530 and the projection module 540 are collectively referred to as the optical subsystem. The optical subsystem may further include additional components such as an entrance pupil and an exit pupil to form an image of the mask 222 on the substrate 550 secured on a substrate stage 560, which may be capable of securing and moving a substrate 550 in translational and/or rotational modes.

In other embodiments where the radiation energy is EUV energy, the mask 222 and the optical subsystem are designed to have a reflective mechanism. In this situation, the optical subsystem includes various reflective components, such as mirrors, designed and configured to achieve the respective functions. The mask 222 has a reflective structure. In one example for illustration, the mask 76 includes a substrate with a low thermal expansion material (such as $TiO_2$ doped $SiO_2$); a multiple reflective multiple layers (ML) deposited on the substrate where the ML includes a plurality of film pairs (such as molybdenum-silicon film pairs); and an absorption layer (such as a tantalum boron nitride layer) deposited over the ML. The absorption layer is patterned according to an OPC'd layout.

In an embodiment, the method 100 and/or system 200 provide for alleviating an increase in design-to-mask cycle time due to the extra steps and processor time for example required for "fracturing" patterns into sequences of polygons (rectangles). For example, the time and process of approximately a feature (e.g., a curvilinear shape) using overlapping rectangles in the OPC process is removed. In some embodiments, this process of representing the OPC output in overlapping rectangles provided for significantly greater file sizes and/or mask data preparation costs. In some embodiments, generating the overlapping rectangles requires e-beam model simulation within the OPC tool. Some embodiments of the present disclosure can reduce or eliminate these requirements.

In an embodiment, the method 100 and/or system 200 provide for alleviating a decrease in pattern fidelity loss between the output of a conventional OPC system and a mask fabrication tool. In other words, the actual intent of the OPC solution is now communicated to a mask writer and/or mask inspection such that the design can be fully optimized by these tools. This is compared to communication of a pattern that has been in affect re-drawn by fracturing into, for example, overlapping rectangles. The mask writer may modify one or more beam parameters because of the template index specification of the curvilinear feature.

Referring now to FIG. 6, illustrated is method 600 of forming a template library. The template library may be substantially similar to the template library described above in block 106 of the method 100, illustrated in FIG. 1, the template library 216 of the system 200 of FIG. 2, and/or the template library 352 and 354 of the system 300 of FIG. 3.

The method 600 begins at block 602 where a plurality of shape types is selected. The shape types selected may include polygons, rectangle, circle, ellipse, ring, pie, arc, and/or other shapes. Referring to the example of FIG. 7, a library 700 is illustrated having a plurality of shape types 702.

The method 600 then proceeds to block 604 where one or more inputs defining the shape types are parameterized. For example, in the case of a rectangle, the width and length may be parameterized. Referring to the example of FIG. 7, the library 700 illustrates parameters 704 for each shape type 702.

The method 600 then proceeds to block 606 where the parameterized shape types are stored. The library 700 may be stored on a computer readable medium such as discussed above with reference to FIG. 3. It is noted that the library 700 illustrates a representation of the shape type at the far right, however this is for ease of understanding and not necessarily stored in the library.

The method 600 then proceeds to block 608 where a plurality of affine transformations is defined. The affine transformation functions may include translation, rotation, scaling, and/or a combination thereof. Other transformations may also be possible. Referring to the example of FIG. 8, a table 800 illustrating affine transformations 802 and their correlated function 804 are provided. It is noted that the table 800 includes a pictorial representation of the transformations for ease of reference and this does not necessitate the pictorial representation is stored.

The method 600 then proceeds to block 610 where the affine transformations are stored. In an embodiment, the affine transformations are stored in a non-transitory computer readable medium, such as discussed above with reference to FIG. 3. The affine transformations may be stored along with the parameterized shape types, or in a different location.

Referring now to FIGS. 11, 12, 13, and 14 illustrated are a block diagrams of embodiments of the method 100 and/or the system 200 described above with reference to FIGS. 1 and 2. The block diagrams illustrate different implementations of one or more aspects of the present disclosure.

The system 1100 illustrates a design that is provided as a layout to an Advanced OPC system. The Advanced OPC system may be substantially similar to the system 204, discussed above with reference to FIG. 2. The Advanced OPC system provides an OPC'd layout, which is then classified by shape using the template library. The template library 216 may be substantially similar to as discussed above with reference to block 106 of FIG. 1, and/or element 216 of FIG. 2. The template library may include the parameterized shape elements and/or the transformations. Output from this classification are indexes to the template library, referred to as template index 220. In an embodiment, this template index 220 is output from the OPC tool 204.

The system 1200 is substantially similar to that of the system 1100 except that the output of the template index is provided to a mask writer. The mask writer may be substantially similar to the mask writer 206, discussed above with reference to FIG. 2 and/or the mask writer 400, discussed above with reference to FIG. 4. Output from the mask writer, as discussed above, is a mask 222. This mask 222 has a pattern that reflects the layout post-OPC. The system 1200 is also illustrative of the template library being provided to the mask writer such for use with the template index.

The system 1300 is substantially similar to that of the system 1200 except that the output of the mask writer, the mask 222, is delivered to the mask inspection. The mask inspection may be substantially similar to the mask inspection 208, discussed above with reference to FIG. 2. The template library 216 is also provided to the mask inspection for use with the template index and/or the mask 222.

Finally, the embodiment of the system 1400 again is similar to that of the system 1300, except that a fractured template is provided to the mask writer. In some cases, the mask writer requires fractured (e.g., representation of curvilinear features as overlapping rectangles) in order to produce the mask 222. In this case, along with the template library as discussed above, the library may also include solutions for fracturing the elements of the library. These fracture templates would be used to substitute fractured features for those features defined by the template library and/or template index. One example of using fractured templates is provided in U.S. Pat. No. 8,812,999, which is hereby incorporated by reference.

While the foregoing has been directed forming photomask for use in lithography processes, it is also recognized that optical proximity correction for other types of lithography may also be applied and benefit from the present disclosure. For example, proximity effects can occur electron beam lithography (EBL) that include that the exposure dose distribution, and hence the developed pattern, is wider than the scanned pattern, due to the interactions of the primary beam electrons with the resist and substrate. Thus, mask-less processes may also benefit from the present disclosure. For example, a layout having OPC applied according to one or more embodiments discussed including defined using parameterized templates as discussed above herein may not be provided to a mask maker, but, for example, to an e-beam pattern generator system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Thus, in one of the embodiments discussed herein, a method includes receiving a layout of an integrated circuit (IC) device. The layout has a curvilinear feature. A template library is provided having a plurality of parameterized shape elements. The curvilinear feature of layout is classified by selecting at least one of the parameterized shape elements that defines the curvilinear feature. A template index is associated with the layout is formed that includes the selected parameterized shape element. The template index and the layout may be provided to a mask writer which uses the template index and the layout to fabricate a pattern on a photomask.

In further embodiments, the classifying the curvilinear feature also includes determining a transformation associated with the selected parameterized shape element. The transformation also defines the curvilinear feature in the layout. The template index may also include the transformation.

As but one embodiment, the selecting of the at least one of the parameterized shape element can include selecting an arc element; the classifying includes defining a radius value for the arc element. See FIG. 9. A transformation associated with the arc may also be determined, wherein the transformation includes a rotation parameter. Again, see FIG. 9.

In another of the embodiments discussed herein, a method includes receiving a layout of an integrated circuit (IC) device having a main feature. A processor of an OPC tool is used to perform an optical proximity correction (OPC) process on the layout to form an OPC'd layout having the main feature and an assist feature. A template library providing a plurality of shape elements each having at least one selectable parameter is provided. Using the processor of the OPC tool, the assist feature is classified by selecting one of the plurality of shape elements and determining a value for the selectable parameter that defines the assist feature. The selected shape element and determined value in a template index may be stored on a non-transitory computer readable medium. The template index can be used to fabricate a photomask.

Also provided are various systems including systems for receiving a layout of a semiconductor device having a curvilinear feature and classifying the curvilinear feature into one or more parameterized shapes. The systems are operable to store an index of the one or more parameterized shapes and associated parameter value. Some systems are interface with or include a mask writer for receiving the classification of the layout and fabricating a mask using the classification of the layout.

What is claimed is:
1. A method of forming a photomask, comprising:
   receiving a layout of an integrated circuit (IC) device, wherein the layout has a curvilinear feature;
   providing a template library having a plurality of parameterized shape elements, wherein each of the plurality of parameterized shapes includes a mathematical description of the shape element including a variable that defines a parameter of the mathematical description;
   classifying the curvilinear feature by:
      selecting at least one of the parameterized shape elements that defines the curvilinear feature;

assigning a value to the variable that defines the parameter; and storing on a computer readable medium a template index associated with the layout that includes the selected parameterized shape element and the value, wherein the template index is stored as one of a complementary file to the layout or an extension of a file including the layout;

sending the template index and the layout to a mask writer; and using the template index and the layout to fabricate a pattern on a photomask.

2. The method of claim 1, further comprising:
performing an optical proximity correction (OPC) process on an initial layout to form the curvilinear feature of the received layout.

3. The method of claim 2, wherein the OPC process includes an inverse lithography technique (ILT) calculation.

4. The method of claim 1, wherein the classifying the curvilinear feature further includes determining a transformation associated with the selected parameterized shape element that defines the curvilinear feature, wherein the determined transformation is a mathematical relationship including a variable; determining a second value for the variable of the mathematical relationship of the determined transformation; and storing the determined transformation and second value in the template index.

5. The method of claim 4, wherein the determining the transformation includes:
selecting at least one transformation from the group consisting of mathematical relationships defining translation, rotation, scaling, or combinations thereof; and
wherein the determining the second value of a parameter of the selected transformation includes determining an x coordinate and a y coordinate.

6. The method of claim 1, wherein the curvilinear feature is an assist feature provided in the layout by an optical proximity correction (OPC) process.

7. The method of claim 1, wherein the selecting the at least one of the parameterized shape element is one of a mathematical description of a rectangle having the variable of width or height, a mathematical description of a circle having the variable of a first radius, a mathematical description of an ellipse having the variable of a second radius, a mathematical description of a ring having the variable of an inner radius or an outer radius, a mathematical description of a pie having the variable of a start angle or an end angle, and a mathematical description of an arc having the variable of an inner radius.

8. The method of claim 1, wherein the selecting the at least one of the parameterized shape element includes selecting a mathematical description of an arc element and wherein the assigning the value to the variable to define the parameter includes assigning the value of a radius value for the arc element.

9. The method of claim 8, wherein the classifying further includes:
determining a mathematical relationship defining a transformation and a second variable for the mathematical relationship defining the transformation associated with the arc, wherein the second variable is a second value for a rotation parameter; and providing the second value for the rotation parameter in the template index.

10. The method of claim 9, wherein the classifying further includes:
determining a second mathematical relationship defining a second transformation associated with the arc, wherein the second mathematical relationship includes a translation parameter, and providing the translation parameter in the template index.

11. The method of claim 1, wherein the layout and the template index are stored as a single file including the extension.

12. A method, comprising:
receiving a layout of an integrated circuit (IC) device, wherein the layout has a main feature;

using a processor of an OPC tool to perform an optical proximity correction (OPC) process on the layout to form an OPC'd layout having the main feature and an assist feature;

providing a template library providing a plurality of mathematical descriptions of shape elements each mathematical description having at least one selectable parameter, each selectable parameter including a variable;

using the processor of the OPC tool to classify the assist feature by selecting one of the plurality of mathematical descriptions of shape elements and determining a value for the variable that defines the assist feature;

storing the selected mathematical description of a shape element and determined value in a template index that is stored on a non-transitory computer readable medium;

after storing the mathematical description of the selected shape element and determined value, performing a fracturing process on the OPC'd layout;

providing the template index and the fractured OPC'd layout to a mask writer;

using the mask writer to fabricate a photomask according to the fractured OPC'd layout and the template index; and using the template library to inspect the fabricated photomask.

13. The method of claim 12, further comprising:
using the processor of the OPC tool to determine a value for a parameter of a mathematical relationship defining an affine transformation associated with the assist feature and the selected mathematical description of the shape element; and storing the value for the parameter of the mathematical relationship of the affine transformation in the template index.

14. The method of claim 12, wherein the selecting one of the plurality of mathematical descriptions of shape elements includes selecting a mathematical description of a ring shaped element; and wherein the value for the variable is an inner radius of the ring shaped element.

15. The method of claim 12, wherein the fracturing the OPC'd layout includes:
providing a plurality of fracture templates; and
selecting a first fracture template of the plurality of fracture templates that corresponds to the selected shape element.

16. The method of claim 12, wherein the template index is an extension included within OPC'd layout file.

17. The method of claim 12, wherein the template index is stored in a layout file format.

18. A system comprising:
means for receiving a layout of a semiconductor device having a curvilinear feature;

means for classifying the curvilinear feature into one or more mathematical representations of parameterized shapes and assigning a value for an associated parameter of the mathematical representation;

means for storing in a file on a computer readable medium an index of the one or more mathematical representations of parameterized shapes and a variable of the mathematical representation defining the associated parameter that is to be assigned the value;

a converter operable to fracture the layout of the semiconductor device such that the layout is represented by a set of overlapping rectangles; and a mask writer for receiving the classification of the layout and fabricating a mask using the classification of the layout and the fractured layout.

19. The system of claim 18, wherein the means for classifying the curvilinear feature further includes selecting a mathematical relationship defining one or more transformations for each of the one or more parameterized shapes.

20. The system of claim 18, further comprising:

a mask inspection tool for receiving the classification of the layout and the fabricated mask.

\* \* \* \* \*